(12) United States Patent
Werberg et al.

(10) Patent No.: US 11,209,493 B2
(45) Date of Patent: Dec. 28, 2021

(54) DETECTING LATENT FAULTS WITHIN A CELL OF AN ENERGY STORAGE SYSTEM

(71) Applicant: Volvo Car Corporation, Gothenburg (SE)

(72) Inventors: Leopold Werberg, Gothenburg (SE); Annika Tidblad Ahlberg, Sollentuna (SE); Nicklas Leuchovius, Gothenburg (SE)

(73) Assignee: Volvo Car Corporation, Gothenburg (SE)

( * ) Notice: Subject to any disclaimer, the term of this patent is extended or adjusted under 35 U.S.C. 154(b) by 0 days.

(21) Appl. No.: 16/894,933

(22) Filed: Jun. 8, 2020

(65) Prior Publication Data
US 2021/0055354 A1    Feb. 25, 2021

(30) Foreign Application Priority Data

Jun. 11, 2019 (EP) ..................... 19179436

(51) Int. Cl.
*G01R 31/392*    (2019.01)
*G01R 31/3835*    (2019.01)
(Continued)

(52) U.S. Cl.
CPC .......... *G01R 31/392* (2019.01); *B60L 3/0046* (2013.01); *B60L 58/12* (2019.02);
(Continued)

(58) Field of Classification Search
CPC .............. G01R 31/392; G01R 31/3835; G01R 31/3648; G01R 31/396; G01R 31/389;
(Continued)

(56) References Cited

U.S. PATENT DOCUMENTS

| 5,764,063 A * | 6/1998 | Katou ................... H02J 7/0021 |
| | | 324/434 |
| 8,797,043 B2 * | 8/2014 | Laber ..................... G01R 31/68 |
| | | 324/522 |

(Continued)

FOREIGN PATENT DOCUMENTS

| CN | 101221224 A | 7/2008 | |
| CN | 103529281 A * | 1/2014 | ........... G01R 19/165 |

(Continued)

OTHER PUBLICATIONS

Dec. 6, 2019 European Search Report issued on International Application No. 19179436.

(Continued)

*Primary Examiner* — Tung S Lau
(74) *Attorney, Agent, or Firm* — Clements Bernard Walker; Christopher L. Bernard

(57) ABSTRACT

A method of detecting a latent fault of at least one cell among a plurality of cells in an energy storage system, and a control unit performing the method, are provided. A method of a control unit of detecting a latent fault of at least one cell among a plurality of cells in an energy storage system is also provided. The method comprises determining State of Health Cell Capacity, SoHCC, and Open Circuit Voltage, OCV, of a selected cell; wherein the selected cell is indicated to have a latent fault if a determined value of the SoHCC of the selected cell is lower than a reference value for the SoHCC and if a determined value of the OCV of the selected cell is higher than a reference value for the OCV.

12 Claims, 11 Drawing Sheets

(51) Int. Cl.
*B60L 58/12* (2019.01)
*B60L 58/16* (2019.01)
*B60L 3/00* (2019.01)

(52) U.S. Cl.
CPC .......... *B60L 58/16* (2019.02); *G01R 31/3835* (2019.01); *B60L 2240/547* (2013.01)

(58) Field of Classification Search
CPC .. G01R 31/367; G01R 31/388; G01R 31/371; B60L 58/12; B60L 58/16; B60L 3/0046; B60L 2240/547; Y02T 10/70
See application file for complete search history.

(56) References Cited

U.S. PATENT DOCUMENTS

| | | | |
|---|---|---|---|
| 9,140,761 B2 * | 9/2015 | Ishishita | G01R 19/16542 |
| 9,166,416 B2 * | 10/2015 | Gerlovin | H02J 7/0019 |
| 9,568,555 B2 * | 2/2017 | Nortman | H02J 9/002 |
| 10,266,064 B2 * | 4/2019 | Izawa | G01R 31/396 |
| 10,302,703 B2 * | 5/2019 | Fleischer | G01R 31/389 |
| 2011/0254502 A1 * | 10/2011 | Yount | B60L 3/0092 320/107 |
| 2012/0249027 A1 * | 10/2012 | Wichert | H02P 29/032 318/400.3 |
| 2012/0262180 A1 * | 10/2012 | Ishishita | G01R 31/396 324/430 |
| 2013/0066573 A1 | 3/2013 | Bond et al. | |
| 2013/0311117 A1 | 11/2013 | Chaturvedi et al. | |
| 2013/0314042 A1 * | 11/2013 | Boehm | G01R 31/367 320/109 |
| 2015/0198671 A1 * | 7/2015 | Nortman | H02J 7/0016 324/426 |
| 2016/0327613 A1 | 11/2016 | Tenmyo et al. | |
| 2017/0010327 A1 | 1/2017 | Nishiguchi et al. | |
| 2018/0149708 A1 | 5/2018 | Shoa et al. | |
| 2018/0375348 A1 * | 12/2018 | Weyen | H02J 7/0026 |
| 2019/0036356 A1 | 1/2019 | Subbaraman et al. | |
| 2019/0120908 A1 | 4/2019 | Naha et al. | |

FOREIGN PATENT DOCUMENTS

| | | | | |
|---|---|---|---|---|
| CN | 105527582 A | | 4/2016 | |
| CN | 103529281 B | * | 8/2016 | ........... G01R 19/165 |
| CN | 106353685 A | * | 1/2017 | ............. G01R 31/36 |
| CN | 106696712 A | * | 5/2017 | ................ B60L 3/00 |
| DE | 102014101728 A1 | * | 8/2014 | ............ H01M 10/48 |
| WO | WO 2018/114107 A1 | * | 6/2018 | ................ H02J 7/00 |

OTHER PUBLICATIONS

Talha Muhammad et al: A Neural Network-Based Robust Online SOC and SOH Estimation for Sealed Lead-Acid Batteries in Renewable Systems. Arabian Journal for Science and Engineering. Springer Berlin Heidelberg. Berlin/Heidelberg.vol. 44., No. 3., 26 Mar. 26, 2018,pp. 1869-1881.

Topan Paris Ali et al: State of Charge (SOC) and State of Health (SOH) estimation on lithium polymer battery via Kalman filter. 2016 2nd International Conference on Science and Technology-Computer (!CST). IEEE.Oct. 27, 2016 . pp. 93-96.

Diao Weiping et al: Energy state of health estimation for battery packs based on the degradation and inconsistency .Energy Procedia. Elsevier. NL. vol. 142. Jan. 31, 2018, pp. 3578-3583.

Ananto Pramudya et al: 11 The state of health of Li-Po batteries based on the battery's parameters and a fuzzy logic system 2013 Joint International Conference on Rural Information & Communication Technology and Electric-Vehicle Technology (RICT & ICEV-T). IEEE, Nov. 26, 2013, pp. 1-4.

* cited by examiner

DETECTING LATENT FAULTS WITHIN A CELL OF AN ENERGY STORAGE SYSTEM

CROSS-REFERENCE TO RELATED APPLICATION

The present disclosure claims the benefit of priority of co-pending European Patent Application No. 19179436.1, filed on Jun. 11, 2019, and entitled "DETECTING LATENT FAULTS WITHIN A CELL OF AN ENERGY STORAGE SYSTEM," the contents of which are incorporated in full by reference herein.

TECHNICAL FIELD

The present disclosure relates to a method of detecting a latent fault of at least one cell among a plurality of cells in an energy storage system, and a control unit performing the method.

BACKGROUND

In an energy storage system, such as a battery, for instance a rechargeable lithium-ion battery used in an electric car, cell faults may occur.

Prior art methods used for detecting faulty cells based on identifying one or more cells having a lower Open Circuit Voltage (OCV) and/or State of Charge (SoC) compared to remaining cells. These methods are effective in identifying cells that already are faulty Preferably, a latent fault of a cell should be detected before it actually develops into an active fault, possibly causing Spontaneous Internal Short Circuits (SISC) which can lead to thermal events such as fire.

Hence, detecting latent faults within battery cells may be crucial in an energy storage system.

SUMMARY

An objective is to provide a method of detecting latent faults in cells of an energy storage system.

If a determined OCV for a selected cell is higher than an OCV reference value for the cell and a determined State of Health Cell Capacity (SoHCC) for the selected cell is lower than an SoHCC reference value for the cell, it is concluded that there may be a latent fault in the selected cell. By determining whether or not the determined OCV is higher than the OCV reference value and the determined SoHCC is lower than the SoHCC reference value, a latent fault of the cell (or at least an indication of a latent fault) can be detected, since the high OCV value and the low SoHCC value indicates that there is something faulty with the cell. Hence, the high OCV value and the low SoHCC value give the cell a signature, which typically deviates from that of the remaining cells in the energy storage system.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated.

BRIEF DESCRIPTION OF THE DRAWINGS

Aspects and embodiments are now described, by way of example, with reference to the accompanying drawings, in which.

DESCRIPTION OF EMBODIMENTS

The aspects of the present disclosure will now be described more fully hereinafter with reference to the accompanying drawings, in which certain embodiments of the invention are shown.

These aspects may, however, be embodied in many different forms and should not be construed as limiting; rather, these embodiments are provided by way of example so that this disclosure will be thorough and complete, and to fully convey the scope of all aspects of invention to those skilled in the art. Like numbers refer to like elements throughout the description.

Figure 1:
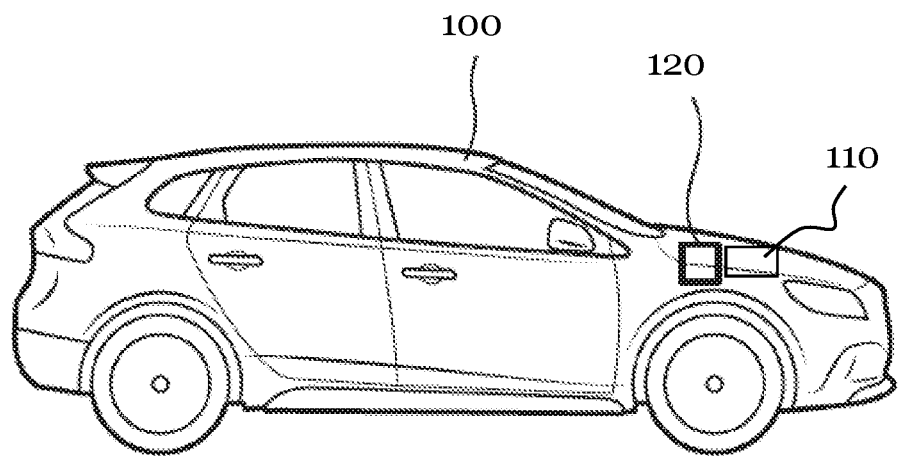
FIG. 1 illustrates an electric/hybrid motor vehicle in which embodiments may be implemented.

FIG. 1 illustrates an electric motor (or hybrid) vehicle 100 according to an embodiment. The vehicle 100 comprises a battery no such as a rechargeable lithium-ion battery which may be charged via a vehicle connector (not shown). It is noted that the car 100 illustrated in FIG. 1 is used as an example only. The method of detecting latent faults of battery cells according to embodiments may be used in other vehicles, such as trucks, boats, aeroplanes, etc. An energy storage system may be used in a vehicle travelling by land, sea or air, or in a stationary energy storage application. Further, it may be envisaged that the invention is implemented in other contexts, such as for example in stationary energy storage systems, aerospace applications, such as satellites, space suits and space stations, military applications, etc.

It is further envisaged that embodiments are implemented with other types of batteries, such as for instance of any of the following types: solid state, lithium-air, lead-acid, nickel-metal hydride, nickel cadmium, etc.

The vehicle 100, or the battery no itself, is typically equipped with an Electronic Control Unit (ECU, 120), which may be implemented by one or more microprocessors executing appropriate software for controlling various systems and components in the vehicle. A car may contain a number of interconnected ECUs for controlling all properties of the car, thereby providing for instance a brake control module (BCM), a speed control module (SCM) or a Battery Management System (BMS). The ECU 120 may further by equipped with an interface for wireless transmission of data, for instance for wireless communication of various parameters and data and/or measured properties of the vehicle 100 to a remote location.

Figure 2:
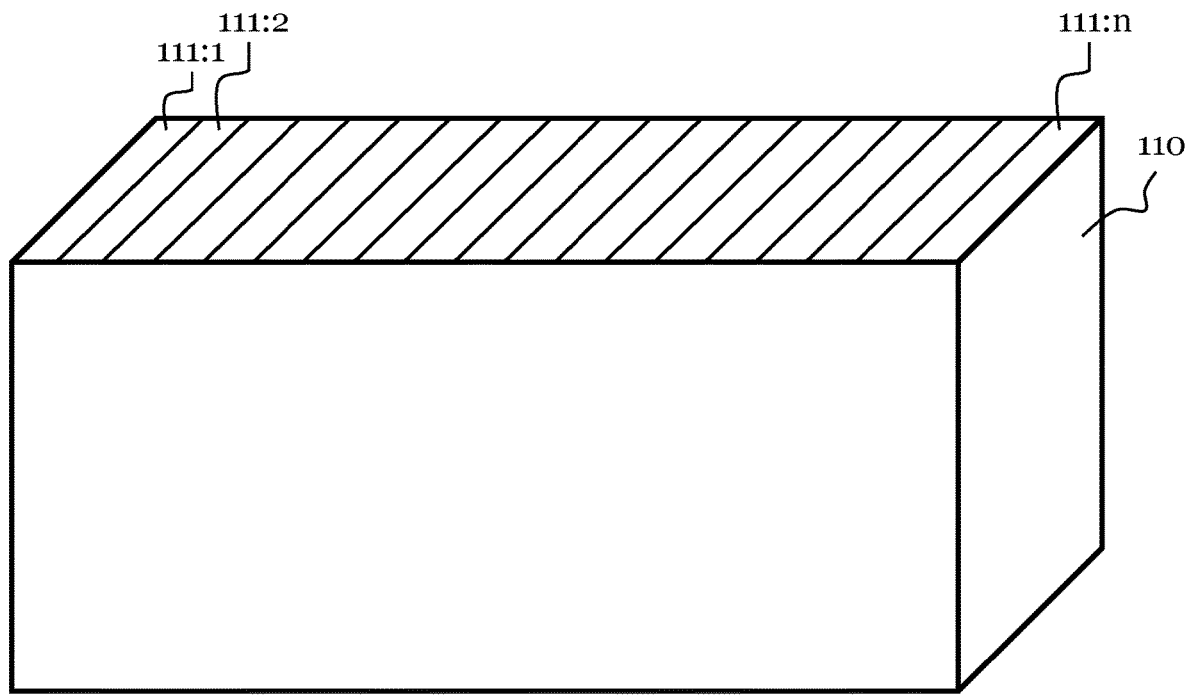
FIG. 2 illustrates an energy storage system in the form of a battery comprising a plurality of cells.

FIG. 2 illustrates a battery 110, commonly referred as a battery pack, which comprises a plurality of cells 111:1, . . . , 111:n. Battery cells 111 are electrochemical units interconnected to form the battery 110.

As previously discussed, it is desirable to detect latent faults in one or more battery cells 111 of the battery 110, since such faults for instance may lead to Spontaneous Internal Short Circuits (SISC) and thermal events potentially causing damages.

Figure 3:
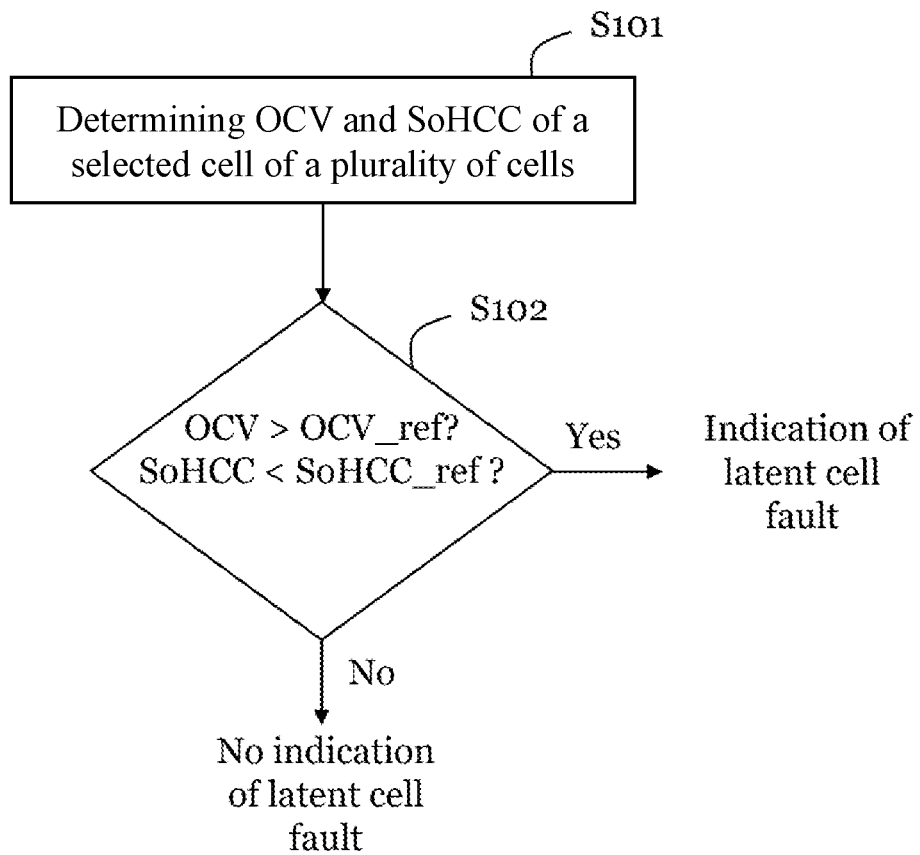
FIG. 3 shows a flow chart illustrating a method of detecting latent faults in battery cells of a battery according to an embodiment.

FIG. 3 shows a flow chart illustrating a method according to an embodiment of detecting latent faults in battery cells of a battery such as a rechargeable lithium-ion battery 110 of FIG. 2.

Now, in order to detect a potential fault, i.e. a latent fault, in one or more of the battery cells 111, a plurality of battery cell properties are taken into account.

A property of a selected cell referred to as State of Health (SoH) is considered. The SoH indicates condition of a cell and is typically graded from 0 to 100% where a full 100% indicates that the conditions of a battery cell match those of the specifications.

Further, a property of the selected cell referred to as Open Circuit Voltage (OCV) is considered. The OCV simply indicates the voltage difference between the two terminals of each battery cell.

These properties may be measured and updated frequently, such as many times per second.

The SoH property may be determined by monitoring State of Health Cell Capacity (SoHCC) of a selected cell, which typically is defined as measured or computed amount of electric charge that the cell can deliver at rated voltage.

The method of detecting a fault in one or more of the battery cells 111:1, . . . , 111:n of the battery no according to an embodiment comprises determining SoHCC and OCV of a selected battery cell and comparing a value of the monitored SoHCC and a value of the determined OCV with a reference value for the SoHCC and a reference value the OCV, wherein the selected battery cell is detected as being faulty if a determined value of the SoHCC of the selected cell is lower than the reference value for the SoHCC while a determined value of the OCV of the selected battery cell is higher than the reference value for the OCV.

Hence, in a first step S101, the ECU 120 acquires information indicating the OCV and the SoHCC of a selected cell, for instance first cell 111:1, for example by performing an actual measurement on the selected cell 111:1, or by receiving the information from the battery 110. Either way, the acquired information representing at least one determined value of each of the OCV and the SoHCC is compared to a reference value for the OCV (OCV_ref) and a reference value for the SoHCC (SoHCC_ref) in step S102.

This information is typically managed and monitored by the BMS provided by the ECU 120. The OCV and the SoHCC may be continuously monitored and compared to the corresponding reference value, which reference values may change over time.

As is shown, if the monitored OCV is higher than OCV_ref and the monitored SoHCC is lower than SoHCC_ref in step S102, the ECU 120 will conclude that there may be a latent fault in the selected battery cell. Hence, an indication of a latent fault may be detected. As is understood, for brevity the method is exemplified for a single cell, while in practice all cells may be continuously monitored.

By determining whether or not the monitored OCV is higher than the OCV reference value and the monitored SoHCC is lower than the SoHCC reference value, the ECU 120 is capable of detecting a latent fault of the cell, since the high OCV value and the low SoHCC value indicates that there may be something faulty with the cell. Hence, the high OCV value and the low SoHCC value give the cell a signature, which typically deviates from that of the remaining cells in the battery 110.

The reference values for the battery cell properties OCV and SoHCC may be attained and selected in a number of different ways.

In an embodiment, it is envisaged that the ECU 120 continuously monitors these properties for each cell and compares the monitored values of the OCV and the SoHCC of each cell to predetermined (not necessarily fixed) reference values OCV_ref and SoHCC_ref in order to determine if one or more cells appear to be faulty.

Figure 4A:
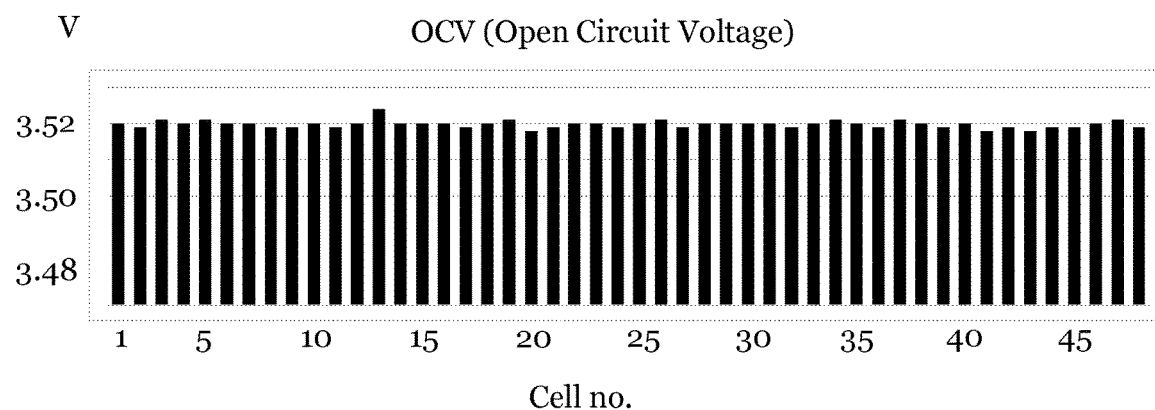
FIG. 4a illustrates a practical example of a first monitored property of cells in a battery.
Figure 4B:
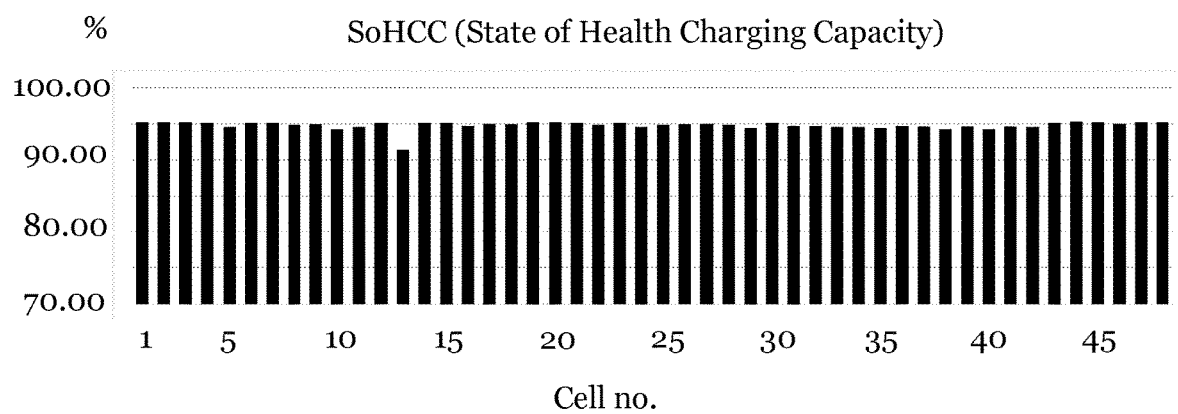
FIG. 4b illustrates a practical example of a second monitored property of cells in a battery.

FIGS. 4a and 4b illustrate a practical example of values of the monitored properties OCV and SoHCC. In FIGS. 4a and b, a battery comprising 48 cells is monitored and as is illustrated cell no. 13 appears to be impaired with a latent fault.

For instance, in a numerical example OCV_ref=3,520 V and SoHCC_ref=94.9%. Thus, the reference values are set such that in a scenario where for a given battery cell (e.g. cell no. 13) the monitored OCV>3,520 V, and the monitored SoHCC<94.9%, the ECU 120 may be conclude that cell no. 13 contains a latent fault.

As a consequence, the ECU 120 may signal to a driver via a display of the vehicle 100, or even to a remote system and/or operator, that battery service is required, or to have the BMS e.g. to limit the current allowed to flow to and/or from the cell until the battery no can be serviced, and even disconnect cell no. 13 which is indicated to contain a latent fault from the remaining cells.

With this embodiment, the ECU 120 determines a signature of a battery cell by concluding whether the monitored value of the OCV is higher than the set OCV reference value while the monitored value of the SoHCC is lower than the set SoHCC reference value.

In a further embodiment, a cell property referred to as State of Charge (SoC) is considered. The SoC indicates charging level of a cell and may be based on OCV and historical data such as electrical current that has flowed in and out of the cell. SoC is a computed value and is updated slower than OCV.

Figure 5:
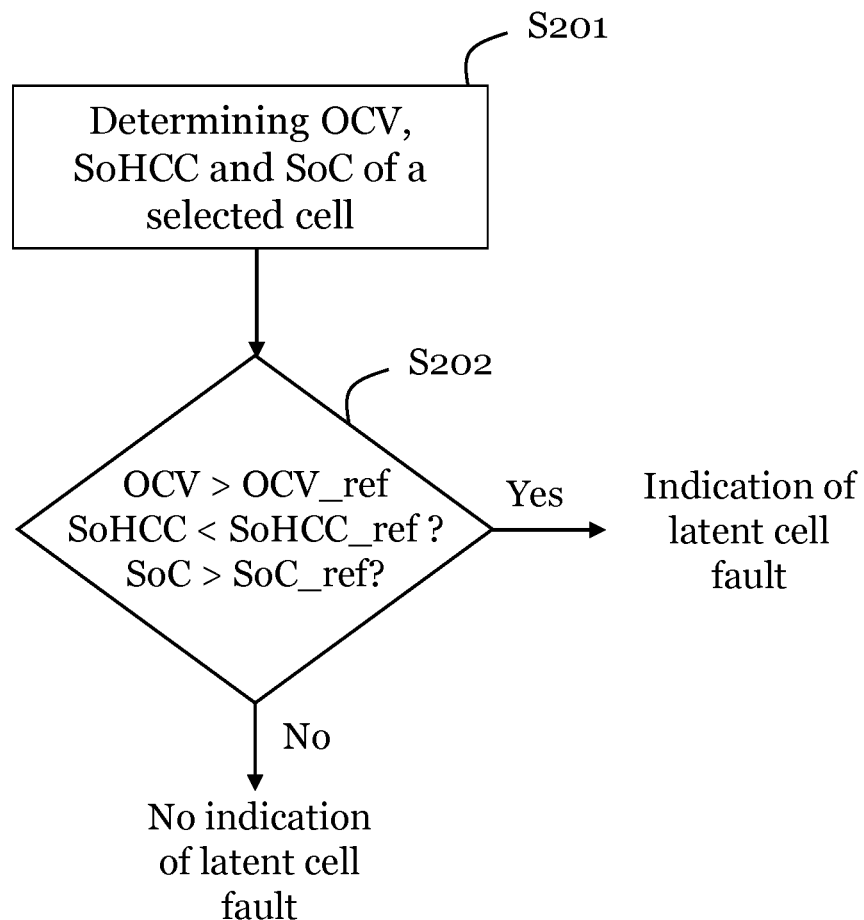
FIG. 5 shows a flow chart illustrating a method of detecting latent faults in battery cells of a battery according to a further embodiment.

FIG. 5 shows a flow chart illustrating a method of detecting latent faults in battery cells of a battery according to this further embodiment.

In a first step S201, the ECU 120 acquires information indicating the OCV, the SoHCC and the SoC of a selected cell, for example by performing an actual measurement on the selected cell, or by receiving information from the battery 110. Either way, the acquired information representing at least one determined value of each of the OCV, the SoHCC and the SoC is compared respectively to a reference value for the OCV (OCV_ref), the SoHCC (SoHCC_ref), and the SoC (SoC_ref) in step S202.

Again, the OCV, the SoHCC and the SoC may be continuously monitored by the ECU 120 and compared to the corresponding reference value, which reference values may change over time.

As is shown, if the monitored OCV is higher than OCV_ref, the monitored SoHCC is lower than SoHCC_ref, and the monitored SoC is higher than SoC_ref in step S102, the ECU 120 may conclude that there is a latent fault in the selected battery cell.

By further taking into account the SoC property in the detection of latent faults, the accuracy in the detection increases as deviation in a further property is required for a cell to be considered to be impaired with a latent fault.

Figure 6:
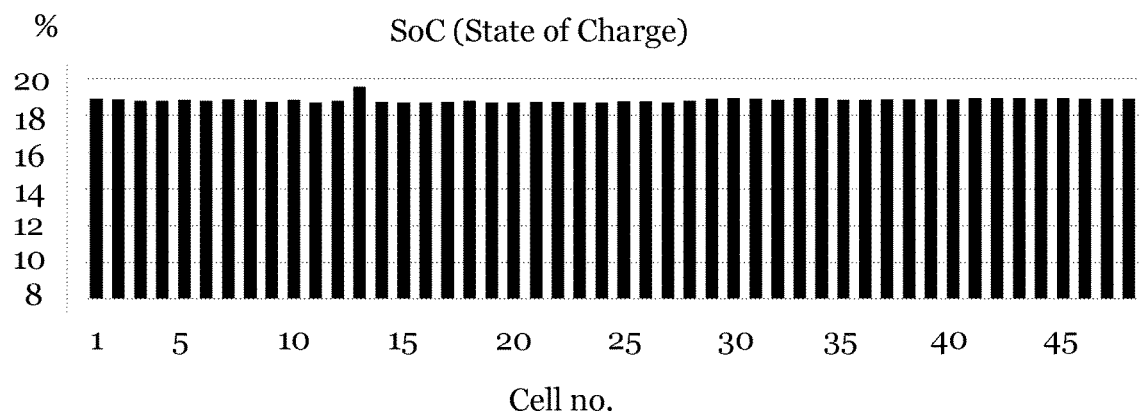
FIG. 6 illustrates a practical example of a third monitored property of cells in a battery.

FIG. 6 illustrates a practical example of values of the monitored property SoC. Again, a battery comprising 48 cells is monitored and as is illustrated cell no. 13 appears to be impaired with a latent fault.

For instance, in a numerical example OCV_ref=3,520 V and SoHCC_ref=94.9% (cf. FIGS. 4a and b), while SoC_ref=18.9%. Thus, the reference values are set such that in a scenario where for a given battery cell (e.g. cell no. 13) the monitored OCV>3,520 V, the monitored SoHCC<94.9% and the monitored SoC>18.9%, the ECU 120 will conclude that cell no. 13 may contain a latent fault.

In another embodiment, a further cell property referred to as State of Health Cell Resistance (SoHCR) is considered, which typically is defined as measured or computed internal impedance of the cell.

By further taking into account the SoHCR property in the detection of latent faults, the accuracy in the detection increases even further as deviation in yet a further property is required for a cell to be considered to be impaired with a latent fault.

Figure 7:
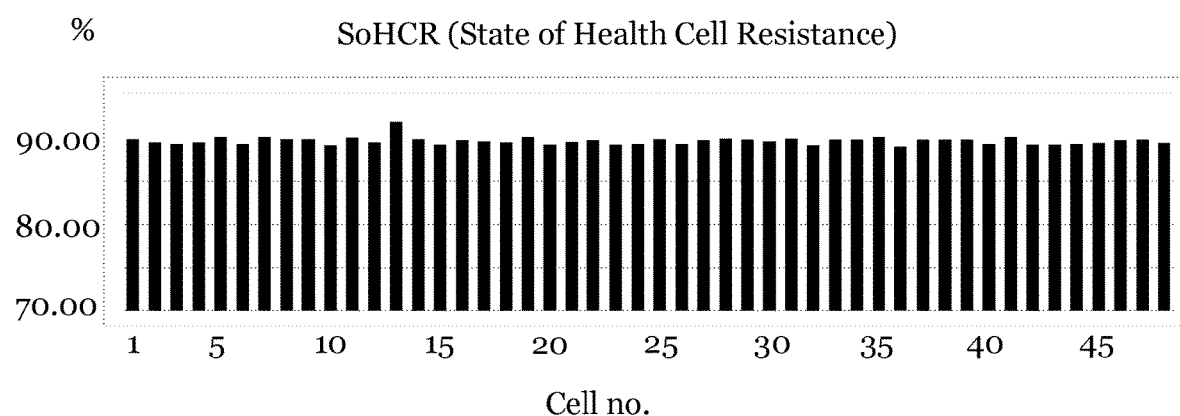
FIG. 7 illustrates a practical example of a fourth monitored property of cells in a battery.

FIG. 7 illustrates a practical example of values of the monitored property SoHCR. Again, a battery comprising 48 cells is monitored and as is illustrated cell no. 13 appears to be impaired with a latent fault. Assuming for instance that the reference value for SoHCR (SoHCR_ref) is set to 89.6%, then the monitored SoHCR must be above 89.6% for a cell to be considered to have a latent fault (in addition to the OCV and the SoC being higher than their respective reference values, and the SoHCC being lower than its reference value).

In another aspect, in order to detect a latent fault in one or more of the battery cells of the battery 110, only the properties SOC and SoHCC are monitored.

Figure 8:
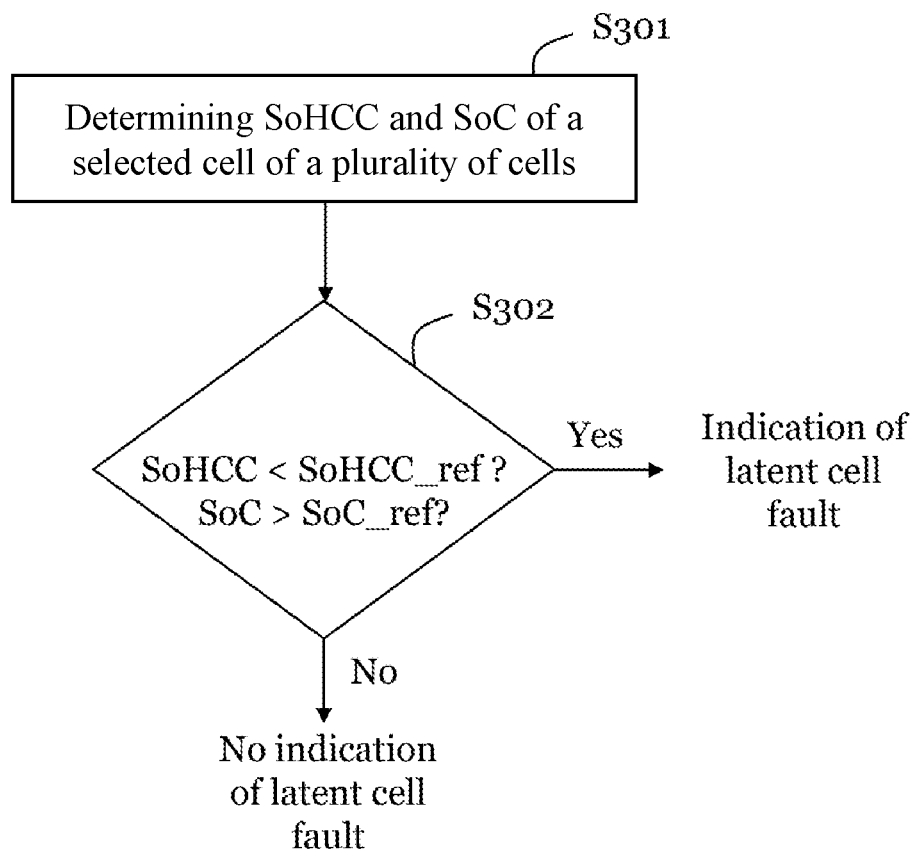
FIG. 8 shows a flow chart illustrating a method of detecting latent faults in battery cells of a battery according to a further embodiment.

FIG. 8 shows a flow chart illustrating a method according to an embodiment of detecting latent faults in battery cells of a battery by monitoring SOC and SoHCC.

In a first step S301, the ECU 120 acquires information indicating the SoHCC and the SoC of a selected cell, for example by performing an actual measurement on the selected cell, or by receiving the information from the battery 110. Either way, the acquired information representing at least one monitored value of the SoHCC and the SoC is compared to SoHCC_ref and SoC_ref in step S302.

As is shown, if the monitored SoHCC is lower than SoHCC_ref, and the monitored SoC is higher than SoC_ref in step S302, the ECU 120 may conclude that there is a latent fault in the selected battery cell. As previously shown in FIGS. 4b and 6, SoHCC_ref=94.9% while SoC_ref=18.9%. Thus, the reference values are set such that in a scenario where for a given battery cell (e.g. cell no. 13) the monitored SoHCC<94.9% and the monitored SoC>18.9%, the ECU 120 concludes that cell no. 13 may contain a latent fault.

In yet another aspect, in order to detect a latent fault in one or more of the battery cells of the battery 110, only the properties OCV and SoHCR are considered.

Figure 9:
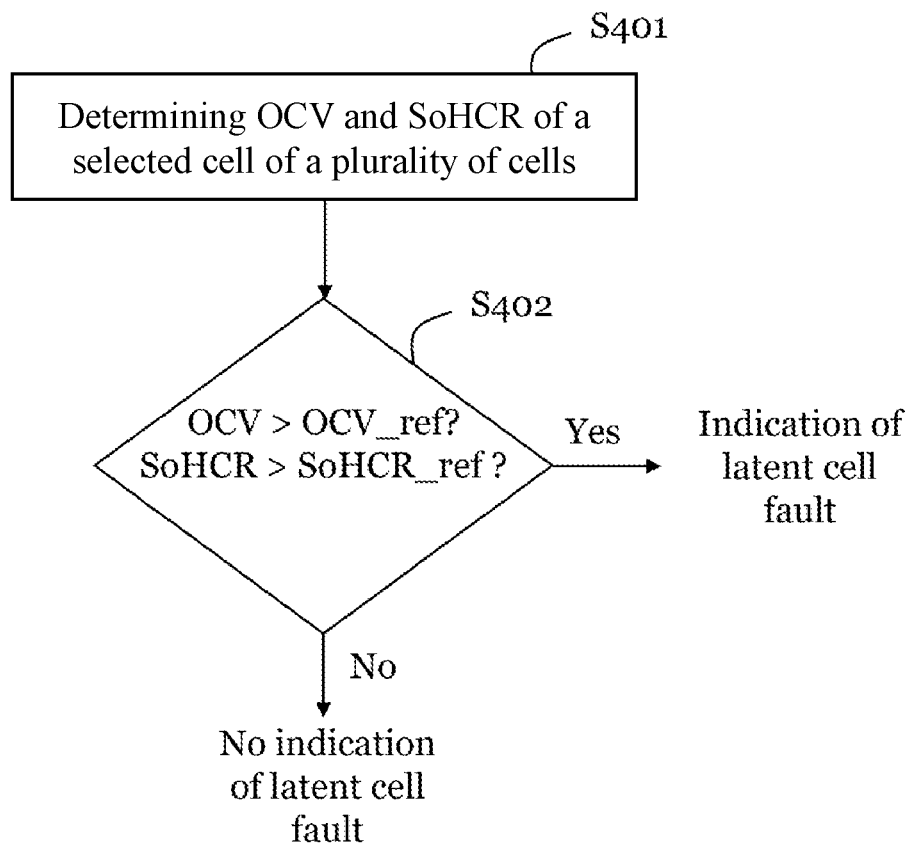
FIG. 9 shows a flow chart illustrating a method of detecting latent faults in battery cells of a battery according to a further embodiment.

FIG. 9 shows a flow chart illustrating a method according to an embodiment of detecting latent faults in battery cells of a battery by determining OCV and SoHCR.

In a first step S401, the ECU 120 acquires information indicating the OCV and the SoHCR of a selected cell, for example by performing an actual measurement on the selected cell, or by receiving the information from the battery 110. Either way, the acquired information representing at least one monitored value of the OCV and the SoHCR is compared to OCV_ref and SoHCR_ref in step S402.

As is shown, if the monitored OCV is higher than OCV_ref, and the monitored SoHCR is higher than SoHCR_ref in step S402, the ECU 120 will conclude that there may be a latent fault in the selected battery cell. As previously shown in FIGS. 4a and 7, OCV_ref=3,520 V while SoHCR_ref=89.6%. Thus, the reference values are set such that in a scenario where for a given battery cell (e.g. cell no. 13) the monitored OCV>3,520 V and the monitored SoHCR>89.6%, the ECU 120 will conclude that cell no. 13 may contain a latent fault.

In still another aspect, in order to detect a latent fault in one or more of the battery cells of the battery no, only the properties SoC and SoHCR are monitored.

Figure 10:
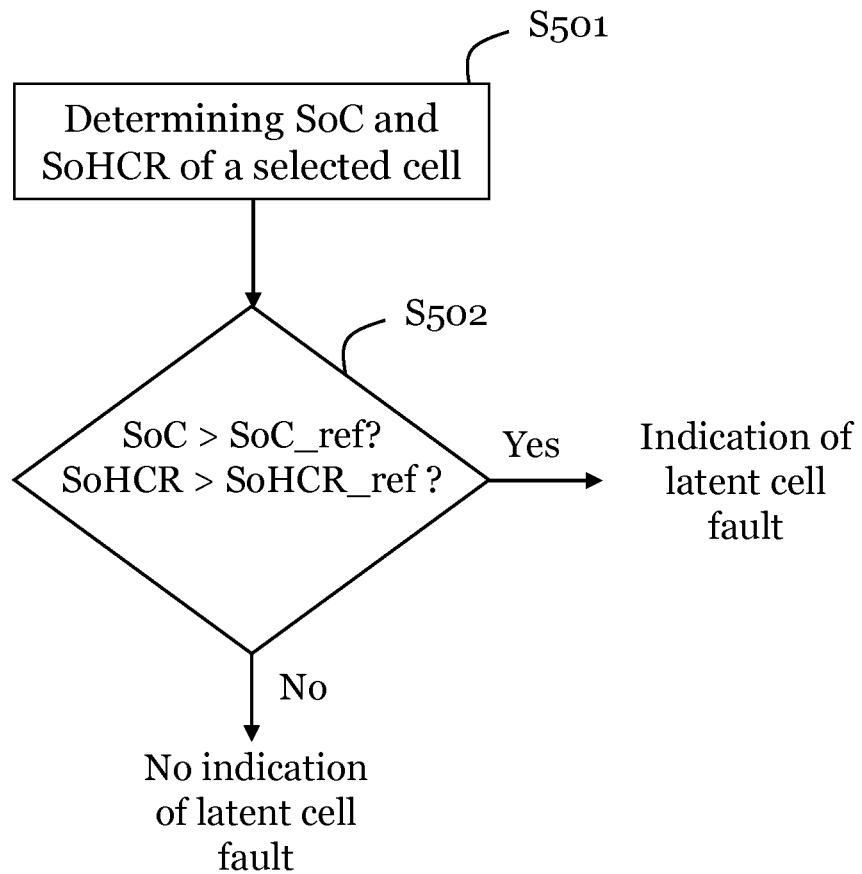
FIG. 10 shows a flow chart illustrating a method of detecting latent faults in battery cells of a battery according to a further embodiment.

FIG. 10 shows a flow chart illustrating a method according to an embodiment of detecting latent faults in battery cells of a battery by considering SoC and SoHCR.

In a first step S501, the ECU 120 acquires information indicating the SoC and the SoHCR of a selected cell, for example by performing an actual measurement on the selected cell, or by receiving the information from the battery no. Either way, the acquired information representing at least one determined value of the SoC and the SoHCR is compared to SoC_ref and SoHCR_ref in step S502.

As is shown, if the monitored SoC is higher than SoC_ref, and the monitored SoHCR is higher than SoHCR_ref in step S502, the ECU 120 will conclude that there may be a latent fault in the selected battery cell. As previously shown in FIGS. 6 and 7, SoC_ref=18.9% while SoHCR_ref=89.6%. Thus, the reference values are set such that in a scenario where for a given battery cell (e.g. cell no. 13) the monitored SoC>18.9% and the monitored SoHCR>89.6%, the ECU 120 will conclude that cell no. 13 may contain a latent fault.

It is understood that the reference values may differ from one battery to another and may thus be individually set for a particular battery. Further it may be envisaged that environmental properties, such as ambient temperature, may affect the setting of the reference values.

In an embodiment, it is envisaged that the determined OCV, SoC and SoHCR for a specific cell and the determined value of the SoHCC should be higher and lower respectively with some margin for the deviating cell to be considered faulty. This is to ensure that the detected deviation is considered to be significant enough to give high confidence in the detection.

It may further be envisaged that the determined OCV, SoC, SOHCC and SoHCR of each cell is compared to a mean or median value of the battery's OCV, SoC, SOHCC and SoHCR respectively, for the remaining cells (the respective mean or median value possibly including the determined values of the selected cell).

In a further embodiment, OCV, SoC, SoHCC and SoHCR of a selected cell is monitored over a time period, e.g. over multiple seconds/minutes/hours/days, to ensure that the monitored values consistently deviate from the reference values, and that the monitored values are not just temporary outliers. This may ensure that the signature is indeed established and may further avoid misdetection. This may also allow the BMS to follow the cell data trend and recognize whether or not the latent fault is progressing.

As previously discussed, FIGS. 4a, 4b, 6 and 7 illustrate a practical example of the monitored properties.

In FIG. 4a, the OCV of each of the 48 cells is monitored. The OCV of cell no. 13 is 3,524 V while the mean and median OCV of all 48 cells is 3,520 V. 3,520 V is used as the reference value in this example. Cell no. 13 has a monitored OCV being higher than OCV_ref, with some margin.

In FIG. 4b, the SoHCC of each of the 48 cells is monitored. The SoHCC of cell no. 13 is 91.34% while the mean SoHCC is 94.82% and the median SoHCC is 94.95%. 94.9% is used as the reference value in this example. Cell no. 13 has a monitored SoHCC being lower than SoHCC_ref, with some margin.

In FIG. 6, the SoC of each of the 48 cells is monitored. The SoC of cell no. 13 is 19.56% while the mean SoC is 18.87 and the median SoC is 18.86%. 18.9% is used as the reference value in this example. Cell no. 13 has a monitored SoC being higher than SoC_ref, with some margin.

Finally, in FIG. 7, the SoHCR of each of the 48 cells is monitored. The SoHCR of cell no. 13 is 91.79% while the mean SoHCR is 89.58% and the median SoHCR is 89.62%. 89.6% is used as the reference value in this example. Cell no. 13 therefore has a monitored SoHCR being higher than SoHCR_ref, with some margin.

Figure 11:
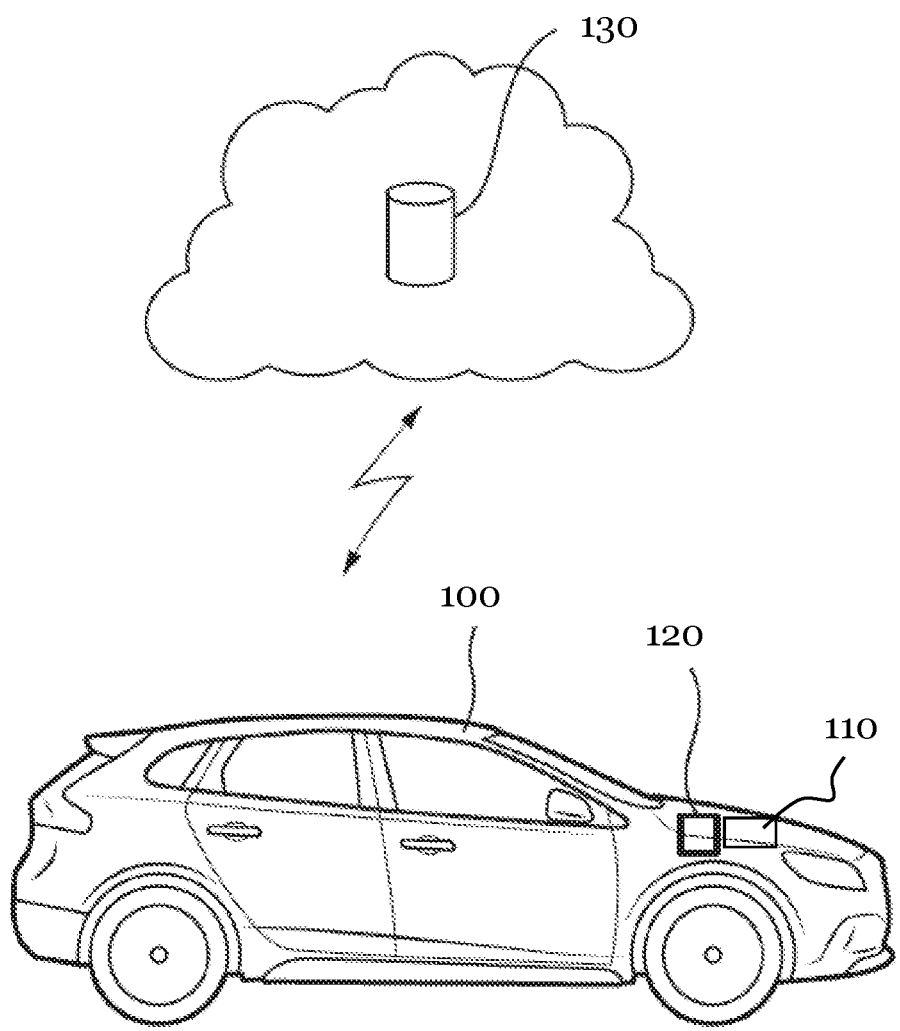
FIG. 11 illustrates wireless communication of data to a remote location according to an embodiment)

FIG. 11 illustrates a further embodiment where the determination as to whether a battery cell of the battery 110 suffers from a latent fault or not is performed remote from the vehicle 100 itself, in this example at a server 130 of for instance a car manufacturer or a car pool operator. Hence, the ECU 120 may wirelessly communicate determined values of SoHCC, SoHCR, SoC, and OCV of one or more selected battery cells, and any appropriately selected reference values for each of the SoHCC, the SoHCR, the SoC and the OCV, to the server 130 which determines from the received data whether one or more cells are faulty or not. Alternatively, the ECU 120 may perform the actual detection and communicate the result to the server 130.

Figure 12:
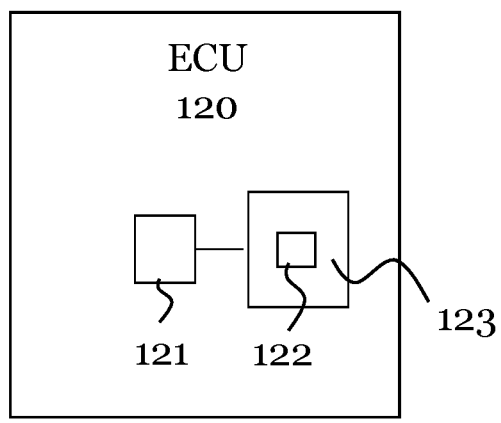
FIG. 12 illustrates an ECU according to an embodiment.

FIG. 12 illustrates an ECU 120 included in the vehicle 100 according to an embodiment. The steps of the method of detecting at least one faulty battery cell among a plurality of battery cells in a battery are in practice performed by a processing unit 121 embodied in the form of one or more microprocessors arranged to execute a computer program 122 downloaded to a suitable storage volatile medium 123 associated with the microprocessor, such as a Random Access Memory (RAM), or a non-volatile storage medium such as a Flash memory or a hard disk drive. The processing unit 121 is arranged to cause the ECU 120 to carry out the method according to embodiments when the appropriate computer program 122 comprising computer-executable instructions is downloaded to the storage medium 123 and executed by the processing unit 121. The storage medium 123 may also be a computer program product comprising the computer program 122. Alternatively, the computer program 122 may be transferred to the storage medium 123 by means of a suitable computer program product, such as a Digital Versatile Disc (DVD) or a memory stick. As a further alternative, the computer program 122 may be downloaded to the storage medium 123 over a network. The processing unit 121 may alternatively be embodied in the form of a digital signal processor (DSP), an application specific integrated circuit (ASIC), a field-programmable gate array (FPGA), a complex programmable logic device (CPLD), etc.

The aspects of the present disclosure have mainly been described above with reference to a few embodiments and examples thereof. However, as is readily appreciated by a person skilled in the art, other embodiments than the ones disclosed above are equally possible within the scope of the invention, as defined by the appended patent claims.

Thus, while various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method of detecting a latent fault of at least one cell among a plurality of cells in an energy storage system, comprising:
   determining State of Health Cell Capacity, SoHCC, and Open Circuit Voltage, OCV, of a selected cell; wherein the selected cell is indicated to have a latent fault if a determined value of the SoHCC of the selected cell is lower than a reference value for the SoHCC and if a determined value of the OCV of the selected cell is higher than a reference value for the OCV.

2. The method of claim 1, further comprising:
   determining State of Charge, SoC, of the selected cell; wherein the selected cell is indicated to have a latent fault if the determined value of the SoC of the selected cell is higher than a reference value for the SoC.

3. A computer program comprising computer-executable instructions for causing a device to perform steps recited in claim 1 when the computer-executable instructions are executed on a processing unit included in the device.

4. The method of claim 2, further comprising:
   determining State of Health Cell Resistance, SoHCR, of the selected cell; wherein the selected cell is indicated to have a latent fault if the determined value of the SoHCR of the selected cell is higher than a reference value for the SoHCR.

5. A computer program product comprising a computer readable medium, the computer readable medium having the computer program according to claim 3 embodied thereon.

6. A method of detecting a latent fault of at least one cell among a plurality of cells in an energy storage system, comprising:
   determining State of Health Cell Capacity, SoHCC, and State of Charge, SoC, of a selected cell; wherein the selected cell is indicated to have a latent fault if a determined value of the SoHCC of the selected cell is lower than a reference value for the SoHCC and if a determined value of the SoC of the selected cell is higher than a reference value for the SoC.

7. A method of detecting a latent fault of at least one cell among a plurality of cells in an energy storage system, comprising:
   determining State of Health Cell Resistance, SoHCR, and Open Circuit Voltage, OCV, of a selected cell; wherein the selected cell is indicated to have a latent fault if a determined value of the SoHCR of the selected cell is higher than a reference value for the SoHCR and if a determined value of the OCV of the selected cell is higher than a reference value for the OCV.

8. A control unit configured to detect a latent fault of at least one cell among a plurality of cells in an energy storage system, the control unit comprising a processing unit and a memory, said memory containing instructions executable by said processing unit, whereby the control unit is operative to:

determine State of Health Cell Capacity, SoHCC, and Open Circuit Voltage, OCV, of a selected cell; wherein the selected cell is indicated to have a latent fault if a determined value of the SoHCC of the selected cell is lower than a reference value for the SoHCC and if a determined value of the OCV of the selected cell is higher than a reference value for the OCV.

9. The control unit of claim 8, wherein the control unit is further operative to:

determine State of Charge, SoC, of the selected cell; wherein the selected cell is indicated to have a latent fault if the determined value of the SoC of the selected cell is higher than a reference value for the SoC.

10. The control unit of claim 9, wherein the control unit is further operative to:

determine State of Health Cell Resistance, SoHCR, of the selected cell; wherein the selected cell is indicated to have a latent fault if the determined value of the SoHCR of the selected cell is higher than a reference value for the SoHCR.

11. A control unit configured to detect a latent fault of at least one cell among a plurality of cells in an energy storage system, the control unit comprising a processing unit and a memory, said memory containing instructions executable by said processing unit, whereby the control unit is operative to:

determine State of Health Cell Resistance, SoHCR, and Open Circuit Voltage, OCV, of a selected cell; wherein the selected cell is indicated to have a latent fault if a determined value of the SoHCR of the selected cell is higher than a reference value for the SoHCR and if a determined value of the OCV of the selected cell is higher than a reference value for the OCV.

12. A control unit configured to detect a latent fault of at least one cell among a plurality of cells in an energy storage system, the control unit comprising a processing unit and a memory, said memory containing instructions executable by said processing unit, whereby the control unit is operative to:

determine State of Health Cell Capacity, SoHCC, and State of Charge, SoC, of a selected cell; wherein the selected cell is indicated to have a latent fault if a determined value of the SoHCC of the selected cell is lower than a reference value for the SoHCC and if a determined value of the SoC of the selected cell is higher than a reference value for the SoC.

* * * * *